United States Patent [19]

Zeis

[11] 4,152,661
[45] May 1, 1979

[54] MODULATION AMPLIFIER

[75] Inventor: Jürgen Zeis, Berlin, Fed. Rep. of Germany

[73] Assignee: Licentia Patent-Verwaltungs-G.m.b.H., Fed. Rep. of Germany

[21] Appl. No.: 893,426

[22] Filed: Apr. 4, 1978

[30] Foreign Application Priority Data

Apr. 5, 1977 [DE] Fed. Rep. of Germany ....... 2715133

[51] Int. Cl.² ............................................. H03F 21/00
[52] U.S. Cl. ................................ 330/202; 330/207 A; 330/251
[58] Field of Search ...................... 330/10, 207 A, 202, 330/251; 325/141, 142, 143; 332/9 R, 22

[56] References Cited

U.S. PATENT DOCUMENTS

| 3,384,838 | 5/1968 | Knutrud | 325/142 X |
| 3,413,570 | 11/1968 | Bruene et al. | 325/142 X |
| 3,506,920 | 4/1970 | Swanson | 325/142 |

FOREIGN PATENT DOCUMENTS 1218557 6/1966 Fed. Rep. of Germany ............. 330/10

Primary Examiner—James B. Mullins

Attorney, Agent, or Firm—McGlew and Tuttle

[57] ABSTRACT

A modulation amplifier having an output amplifier element which contains an accumulation choke, a switching tube and a low-pass filter connected in series, with a commutation diode connected to the switching tube is disclosed. The switching tube is controlled by pulse duration-modulated pulses and a semiconductor switch is connected between the switching tube and the pulse duration-modulated pulses. The semiconductor switch comprises two branches, each of which are connected to a different electric potential and each including a controlled semiconductor which acts as a switch, one of the branches being controlled into a conducting state and the other of the branches being controlled into a non-conducting state upon a potential jump in the pulse time-modulated pulses in either the increasing or decreasing directions. The modulation amplifier may further include a control circuit for stabilizing at least one of the potentials, which comprises a switch element as a primary control element which is controlled by an auxiliary pulse duration-modulated signal. A chopper is provided with following filter means for providing an actual value to be fed to the control circuit, which is derived from the output voltage of the filter means.

12 Claims, 10 Drawing Figures

MODULATION AMPLIFIER

FIELD AND BACKGROUND OF THE INVENTION

This invention relates in general to modulation amplifiers and, in particular, to a new and useful modulation amplifier with an output amplifier element, which contains an accumulation choke, a switching tube preceding a low-pass filter and working in switch operation, as well as a commutation diode, in which the switching tube is controlled by an exciter in the rhythm of pulse duration-modulated pulses.

DESCRIPTION OF THE PRIOR ART

A modulation amplifier similar to the inventive one is known in principle from German Pat. No. 1,218,557 and in detail from German Disclosure (Auslegeschrift) No. 1,808,578. The known detailed solution has some weaknesses which manifest themselves particularly at high transmitter powers of, for example, 100 kW and more, which are of particular interest to the invention. A drive tube which works as a cathode follower is used as a driver for the switching tube in the known arrangement. The grid of the driver tube is controlled by pulse length-modulated pulses and, in addition, by amplitude modulated pulses. After amplification by the driver tube, the pulses are still pulse length-and amplitude modulated, which indicates that the driver tube does not work in switch operation. This results in losses which lead to reduced efficiency.

The driver tube applies a postitive potential to the control grid of the switching tube in the switched-through state. A current path must be provided from the negative potential to the control grid of the switching tube in the blocked state of the driver tube, so that the grid capacitances can be discharged in this state. This current path also carries current in the conductive state which likewise leads to undesired power losses.

SUMMARY OF THE INVENTION

The object of the present invention, therefore, is to improve the efficiency of a modulation amplifier with a switching tube by avoiding losses as far as possible. The efforts must naturally concentrate on the driver, because the principal mode of operation of the switching tube is fixed.

This problem is solved, according to the invention, as follows: The driver is a semiconductor switch with two branches connected to different electric potentials which contain controlled semiconductors working in switch operation. At a potential jump of the pulse duration-modulated pulses which takes place in one of the two directions, one branch is conductively controllable and the other is non-conductively controllable.

Due to the semiconductor switch with semiconductors, losses are avoided to a great extent because the voltage and the current are alternately zeroed in switch operation by the semiconductors so that, in the ideal case, namely, when the switching is effected in an inertialess manner, the lost power becomes zero. The use of the controlled semiconductors over a driver tube also has the advantage that a filament power requirement is eliminated. Finally, the use of two branches with controlled semiconductors leading to different potentials has the effect that a current path constantly carrying current to the control grid of the switching tube, in which lost power is likewise consumed, can be eliminated. In addition, the current supply for the semiconductors is less expensive than for a driver tube; the life expectancy of semiconductors is higher, and the space required is lower. Shorter edges can also be achieved with the pulses controlling the switching tube if care is taken that the grid capacitances of the switching tube are discharged by the second branch at the start of its conducting state. These short edges result additionally in a reduction of the losses in the switching tube.

The advantages of the invention can be utilized particularly well if the control of at least one branch is effected with pulse duration-modulated pulses of constant amplitude only up to a point close to the saturation of the semiconductors. In this way, the aforementioned problems can be solved. The solution will be discussed more fully below in connection with the long switching times of transistors.

Since the semiconductors feed the respective potentials directly to the switching tube in the switched-through state, it is necessary, for the proper operation of the switching tube, that the potential fed to the control grid of the switching tube in pulses for switching-through is stabilized. It is desirable that the stabilizer used for this purpose likewise works with maximum efficiency, that is, with a minimum of losses.

This can be achieved by providing a control circuit for the stabilization of at least one of the potentials which contains, as a primary control element, a switch element of a chopper with following filter means. The control circuit is controlled by a pulse duration-modulated auxiliary signal, where the actual value fed to the control circuit is derived from the output voltage of the filter means.

It can arise that, in the semiconductor switch, which consists of two alternately conductively controllable branches, both branches are briefly conductive during the switching. This can lead to the destruction of semiconductors. This danger can be eliminated, however, by having one branch directly conductively controllable by the pulse time-modulated pulses, and the other or second branch controllable by the first branch. This has the effect that the second branch becomes conductive only when the first branch is already blocked. If the second branch is the one through which a negative potential is allowed to flow to the control grid of the switching tube in the conductive state, it is sufficient if the second branch is not conductively controllable for the entire duration of the respective switching phases of the pulse duration-modulated pulses, but only long enough so that the grid capacitances of the switching tube are discharged. The reason for this is that the negative potential on its control grid which is necessary for blocking the switching tube can be maintained for the rest of a negative potential of the pulses. When switching to the positive grid control potential, therefore, the two branches of the driver are not conductively controlled at the same time, which could lead to their destruction.

Because of the properties of a switching tube, a necessary limitation of the lost power of the screen grid co-modulation of the pulse duration-modulated pulses may become necessary on the control grid of the switching tube, that is, amplitude-modulation in the same sense as the fundamental oscillation, that is, the modulation oscillation of these pulses. A tetrode can then be better utilized by extensive modulation in switch operation. When using the principle of a semiconductor switch as a driver, according to the invention, co-modulation of the pulses controlling the semiconductors in the two branches would be ineffective if the semiconductors work in switch operation.

According to another advantageous improvement of the modulation amplifier according to the invention, a potential switched-through by at least one semiconductor is therefore co-modulated since a control element preceding at least one of the branches is provided for varying the respective potential in the rhythm of portions of the fundamental oscillation of the pulse duration-modulated pulses in such a way that the potential in the branch varies in the same sense with the portion of the fundamental oscillation. The power loss occurring under these circumstances is lower than the power loss in the driver which is avoided by the invention, as compared to that in the state of the art. The power loss caused by the control element can be reduced even further by additional means.

It is advisable, in a switching tube with a screen grid, in order to avoid damage to the screen grid by excessive screen grid losses, to arrange the control element ahead of at least that branch which is connected to the higher potential. It has been found that it is sufficient in a switching tube with a screen grid if the control element is only arranged ahead of this branch, that is, if only the positive pulses of the pulse duration-modulated pulses controlling the switching tube are co-modulated.

By switching through the semiconductors in pulses in that branch of the semiconductor switch which is arranged behind the control elements, the control element is subjected to a greatly fluctuating load which can lead to troubles within the circuit parts. This can be avoided by arranging a transverse capacitor at the output of the control element as a charging accumulator. Its discharge time-constant, however, must not be so great that the co-modulation voltage which is impressed on the voltage given off by the control element is distorted.

If a transverse capacitor with greater value is selected, a current path for discharging the transverse capacitor during each half of the half waves of the co-modulated first potential tending toward the other potential can be provided in the branch connected to a first potential at high co-modulation frequencies.

The control element for co-modulating at least one of the potentials between which the semiconductor switch operates has a power loss. This unavoidable power loss in the co-modulation can be reduced with an active amplifier element as a control element, if the supply voltage of the control element, preferably one with a pentode-like output family characteristic which is variable in time with the fundamental wave, or portions thereof, is reduced possibly to the minimum amount. This is only slightly above the control voltage of the control element which is required to maintain the control function. This can be achieved if the quantity controlled by the control circuit and, hence, the control potential, is controllable by a controlling guide quantity which is fed to the control circuit.

The control of the controlled quantity is effected with a signal which is derived from the fundamental oscillation of the pulse duration-modulated pulses, where only the lower frequency portions of the fundamental oscillation can be used under certain circumstances for controlling the controlled quantity in view of undesired oscillations, which can be excited in the filter means following the chopper. The control can be effected by influencing the nominal value or the actual value of the control circuit.

In this method, it is assumed that the control element is provided between the filter means following the chopper and the subordinated branch of the semiconductor switch, which is used for the subsequent variation of the quantity regulated by the control circuit and controlled in the low frequency range of the modulation voltage in the same way as the low frequency portions of the fundamental oscillation (co-modulation). The control element preferably contains at least one emitter-follower, for example, with a transistor having a pentode-like output family characteristic. In order to reduce the delay times of the transistor which is parallel to the base-emitter diode of at least one emitter-follower, at least one resistor can be switched, and in order to reduce the internal resistance at high frequencies, a capacitor can be connected in parallel to the input of the first emitter-follower in the case of several emitter-followers in a cascade connection.

The control of the two branches of the semiconductor switch which is used as a driver can be effected in a simple manner so that the branch which is conductively controllable by the pulse time-modulated pulses is also made non-conductively controllable by these pulses.

As indicated above, the use of controllable semiconductors, particularly switching transistors in the branches of the driver, can also have disadvantages. These arise when the switching times at the preferred switching frequency of about 50 kHz are too long in the power transistors available today. This disadvantage can be avoided, however, if one branch contains a switching transistor as a controllable semiconductor amplifier. The base of this amplifier precedes at least one structural element, which causes a voltage drop when the switching transistor is conductive and, starting from the reference point of this voltage stop, which is remote of the base, an electrical connection leading over a diode with a rectified (second) voltage drop to a collector feeding point exists, and where the second voltage drop is smaller by more than the sum of the collector-emitter saturation voltage and the voltage between the collector feeding point and the collector of the feeding transistor than the sum of the first voltage drop and of the base-emitter voltage of the conducting switching transistor. The direction of current flow for the diode as seen from the reference point which is remote of the base is the same as that of the base-emitter diode. These accommodations prevent the switching transistor from being controlled into saturation, and have the effect that the base current is limited.

Accordingly, an object of the invention is to provide a modulation amplifier having an output amplifier element which contains an accumulation choke, a switching tube and a low-pass filter connected in series, with a commutation diode connected to the switching tube, the switching tube being controlled by pulse time-modulated pulses, comprising, a semiconductor switch connected between the switching tube and the pulse duration-modulated pulses, including two branches, each connected to a different electric potential and each including a controlled semiconductor acting as a switch, one of said branches being driven into a conducting state and the other of said branches being driven into a non-conducting state upon a potential jump of the pulse duration-modulated pulses in either a positive or negative direction.

Another object of the invention is to provide a modulation amplifier which is simple in design and efficient from the standpoint of reducing energy losses.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
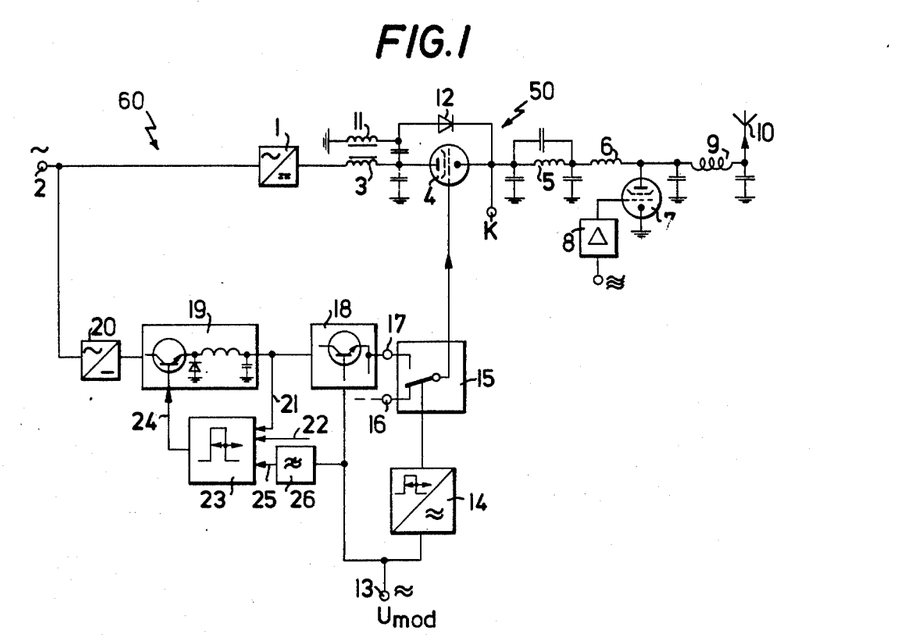
FIG. 1 is a schematic block circuit diagram of a modulation amplifier.

Referring now to the drawings in particular, the invention embodied therein in FIG. 1, discloses a modulation amplifier, generally designated 60, having an output amplifier element, generally designated 50, which contains an accumulation choke 3, 11, a switching tube 4 and a low-pass filter 5 connected in series, with a commutation diode 12 connected to the switching tube 4. The switching tube 4 is controlled by pulse duration-modulated pulses emanating from a pulse duration-modulator 14. Semiconductor switch 15 is connected between the switching tube 4 and the pulse duration-modulator 14 and comprises two branches, each connected to a different potential at terminals 16 and 17, respectively, wherein each branch includes a controlled semiconductor which acts as a switch and wherein one of the branches is driven into a non-conducting state upon a potential jump of the pulse duration-modulated pulse emanating from the pulse duration-modulator 14 in either the plus or minus direction.

The upper part of FIG. 1 is based on FIG. 8 of German Pat. No. 1,218,557. A power pack 1 is provided for supplying direct current, which is connected to a line terminal 2. Power pack 1 feeds in sequence; the choke 3, the switching tube 4, the low-pass filter 5, another choke 6 and a transmitter tube 7. The control grid of transmitter tube 7 receives an oscillation over an amplifier 8 having a transmission frequency which is anode-modulated in the transmitter tube and which is fed, over a tuned resonant circuit 9, to an antenna 10.

The modulation voltage required for modulation is supplied by switching tube 4, which is controlled by pulses that are pulse duration-modulated in time rhythm with the modulation oscillation. When switching tube 4 is in the conductive state, current flows through choke 3 over switching tube 4 to low-pass filter 5. Since a choke 11 is coupled with a choke 3, so that together they act as an accumulation choke, the current flows over choke 11 and a commutation diode 12 when switching tube 4 is blocked. A switching frequency of 50 kHz is filtered out by low-pass filter 5, so that only the fundamental oscillation of the pulse duration-modulated pulses arrive over choke 6 at the anode of transmitter tube 7. This fundamental oscillation (which can consist of a mixture of sound oscillations) is the modulation oscillation for the amplification of which switching tube 4, with the following low-pass filter 5, is provided. The mode of operation of the switching tube 4 as a pulse duration-modulated switch serves to improve the efficiency of the modulation amplifier whose output amplifier element is switching tube 4.

Compared to the known arrangement of German Auslegeschrift No. 1,808,578, according to FIG. 1, which leads to difficulties particularly at higher powers and in short wave transmitters with a wide frequency range, the arrangement represented in FIG. 1 has the advantage that the cathode of transmitter tube 7 is at ground potential. Although switching tube 4 has a high potential, it is easier to control, because of the lower switching frequency, compared to the transmission frequency.

There is a linear relation between the modulation voltage, which is fed to a terminal 13, and the pulse duration of the pulse duration-modulated modulation voltage which controls switching tube 4. This linearity is ensured by a pulse duration-modulator 14, designed according to known principles, in which a comparison is made between a symmetrical triangular oscillation with switching frequency and the modulation voltage on terminal 13. In this way, pulse duration-modulated pulses whose widths increase with rising modulation voltage on terminal 13 and decrease with falling modulation voltage is obtained.

An exciter in the form of the semiconductor switch 15, controlled by pulse duration-modulator 14, is used as a driver of switching tube 4. Its function is to switch switching tube 4 rapidly between the conducting state and the blocked state. It is also expedient if the positive output voltage of the driver can be modulated, so that the screen grid losses can be reduced during the connection time of switching tube 4, when the latter is a tetrode or pentode. Switching tube 4 can then be modulated in a very wide range, resulting in a high efficiency.

Semiconductor switch 15 is equipped with controllable semiconductors. This did not, however, seem promising for achieving the required short switching time with the transistors available on the market. Semiconductor switch 15, switches in time with the pulse duration-modulated pulses from 14, between a negative potential on terminal 16 and a positive potential on terminal 17. These potentials are related to the cathode potential of switching tube 4. The positive potential on terminal 17 is stabilized and is variable in time with the modulation voltage (or a portion thereof; co-modulated) in order to reduce the above-mentioned screen grid losses.

For co-modulation, a control element 18 is used which is controlled by the modulation voltage on terminal 13. A chopper 19 is provided with following filter means for stabilizing the potential. The chopper 19 receives DC voltage from a rectifier 20 and acts, with a controlled switch element contained therein, as a primary control element which is a part of a control circuit with an actual value line 21 and a nominal value line 22.

The difference between the actual value and the nominal value is formed in a regulator 23 and is transformed into a control quantity which arrives over line 24 to the primary control element (chopper 19). This control quantity is a pulse duration-modulated auxiliary signal generated in regulator 23 with a switching frequency of 20 kHz, for example. In combination with chopper 19, this has the advantage that the voltage stabilization can be effected by the control circuit with great efficiency.

A low-pass filter 26 is provided between terminal 13 and a line 25 for an additional guide quantity, for which low-frequency portions of the modulation voltage can be used. Low-pass filter 26 has a cut-off frequency on the order of several hundred hertz. The efficiency of control element 18 can be improved at low modulation frequencies with filter 26, since the collector-emitter voltage of the transistor contained in control element 18 in grounded collector ground connection is reduced in the same rhythm as its base voltage.

Figure 2:
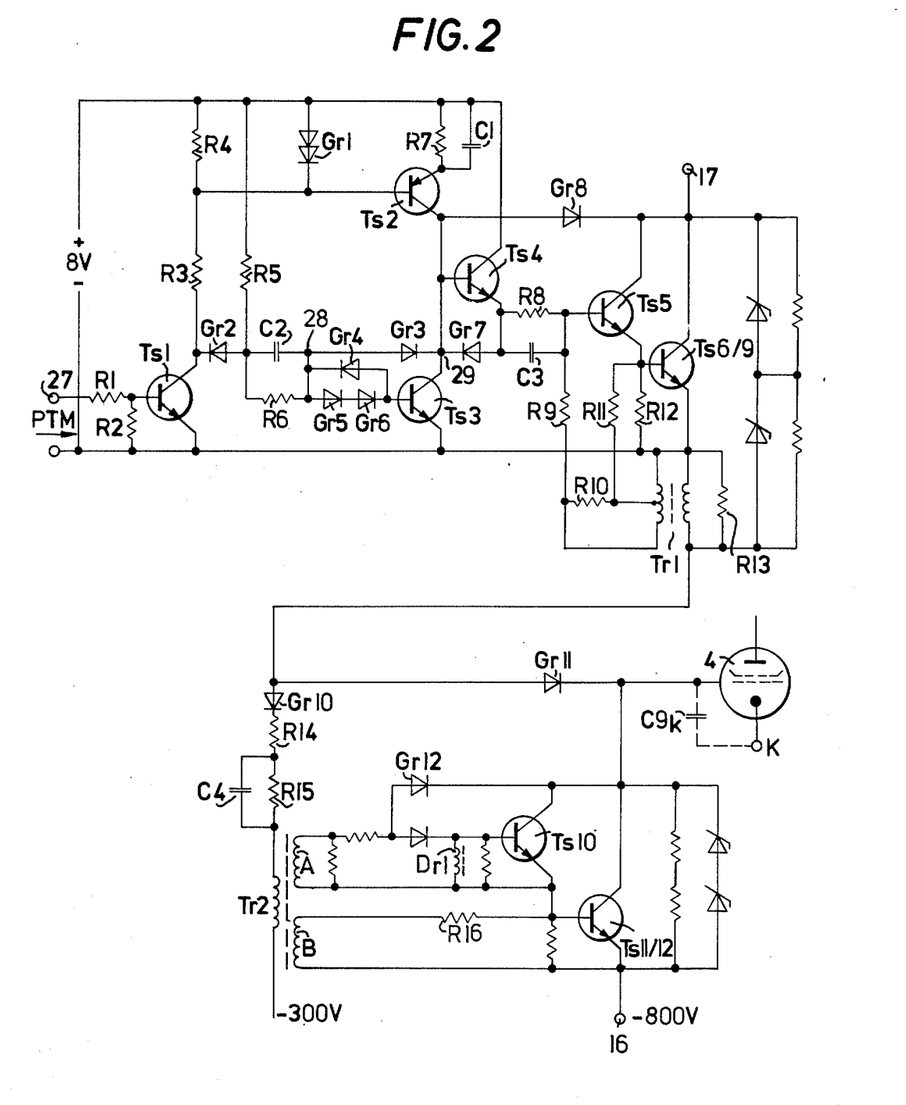
FIG. 2 is a schematic diagram of the semiconductor switch in accordance with the invention.

FIG. 2 is a detail of the semiconductor switch 15 which is between terminals 17 and 16 and switching tube 4 from FIG. 1. A switching stage is shown in the top and bottom part of FIG. 2. The representation is simplified to the extent that the transistors or controlled semiconductor rectifiers Ts6/9 and Ts11/12, respectively, are supported, in practice, by parallel-connected transistors to cover the current consumption. The required dielectric strength is obtained by replacing the upper and lower circuit parts of FIG. 2 by a series-connection of these circuit parts. In order to connect and disconnect switching tube 4, its control grid is alternately connected with control element 18 (FIG. 1) and with a negative reverse voltage on terminal 16. Because of the current-dependent switching times of the transistors, switching tube 4 is connected by the pulse duration-modulated modulation voltage, which arrives from pulse length modulator 14 (FIG. 1) to terminal 27 (PDM signal, FIG. 2), that is, the switching stage which connects the control grid with the reverse voltage of −800 V is, however, derived from the transition of the above-mentioned (force-controlled) switching stage to the blocked state. In this way, the destruction of the transistors is positively avoided when the reverse voltage is turned on while the voltage of terminal 17 is still connected through.

In order to avoid the reverse case where the voltage of terminal 17 is connected through while the reversing voltage is still turned on, the transistors for the reverse voltage are connected through so long as the grid-cathode capacitance Cgk of switching tube 4 is recharged. Subsequently, the grid voltage on the grid of switching tube 4 is maintained by resistances. The size of the resistances is limited by the charging risk of the grid.

The upper part of FIG. 2 represents the force-controlled switching stage which is connected and disconnected by the PDM signal. This part consists of switching transistor Ts6/9 and a preceding PDM-amplifier. The switching transistors must be capable of supplying the sum of the grid current and the recharging current of the grid-cathode capacitance in the switched-through state. In order to avoid accumulation periods, the transistors must not be controlled up to saturation. With a current amplification factor of about 5, five parallel-connected switching transistors would require about a 4 ampere base current for a 20 amp. collector current. In order to reduce this value, a switching transistor Ts5 is applied as an emitter-follower, which is followed, in practice, by four parallel-connected switching transistors Ts6/9. In this way, transistor Ts4 requires only about 1 ampere control current for switching transistors Ts5 and Ts6/9 on.

Without the PDM-signal at terminal 27, a transistor Ts1 is blocked. Consequently, the constant current source Ts2 is also blocked. Ts3 is conductive, because it receives base current over resistors R5 and R6 and diodes Gr5 and Gr6. A diode Gr3 prevents transistor Ts3 from being controlled into saturation by limiting the base current. That is, when the collector-emitter voltage of transistor Ts3 drops to about 1.5 V or less, current flows over diode Gr3 to the collector. In this state, the voltage drop from the reference point 28 remote of the base to the emitter is composed of the forward voltages of diodes Gr5 and Gr6 and of the base-emitter diode, compared to the voltage drop from reference point 28 over collector feeding point 29 to the emitter. This voltage drop is composed of the forward voltage of diode Gr3 and of the collector-emitter voltage, which must not drop to the saturation voltage.

As long as Ts3 is conductive, transistors Ts4, Ts5 and Ts6/9 are blocked. When a positive PDM-pulse arrives at terminal 27, Ts1 becomes conductive and turns on the constant current source from transistor Ts2 over resistors R3 and R4. At the same time, Ts1 short-circuits the base voltage of Ts3 over a diode Gr2. Ts3 is blocked faster, because negative voltage arrives from a capacitor C2 at the base of Ts3 over a diode Gr4. The height of the voltage depends on the ratio of the resistance values of R5, for example, 180 ohm, and R6, (for example, 74 ohm, for a transistor Ts3 of the type BSV60). After Ts3 is blocked, the emitter-follower Ts4 and the switching transistors Ts5 and Ts6/9 becomes conductive. The connection is accelerated by capacitors C1 (current increase) and C3 (short-circuit of R8). When the current begins to flow through the switching transistors Ts5 and Ts6/9, a positive voltage is generated with a transformer Tr1 which accelerates the connection over resistors R9 and R11. When the collector-emitter voltage of the switching transistors has dropped to about 6V, a diode Gr8 becomes conductive. By limiting the base current of Ts4 and Ts5 by means of diode Gr8, a further control of the switching transistors to saturation is prevented.

When the positive PDM-pulse is turned off, transistor Ts1 blocks. The switching time is made sufficiently short by a resistor R2. The constant current source blocks rapidly, because the base-emitter diode of Ts2 is biased by the charge of C1. By bridging R6 with C2, Ts3 is switched on with a higher base current and blocks the transistors Ts4, Ts5 and Ts6/9. The blocking is accelerated, because the base of Ts5 is negatively biased over a diode Gr7 with the charge of C3. A further acceleration of the blockage is achieved by transformer Tr1, whose negative pulse acts over resistors R9 and R11. The transformer is so damped by a resistor R13, that, when the switching transistors are disconnected, they are not connected again by a building-up process due to the coupling action of the transformer.

An auxiliary circuit of Zener diode and resistors parallel to the switching transistors prevents the reverse voltage from rising unduly. The wiring is necessary because, in the cascade-connection of several of the upper circuit parts of FIG. 2, reverse voltage peaks can appear, due to the slightly different switching periods of the individual switching stage.

The switching stage in the lower part of FIG. 2, which is released by the blockage of the upper part, force-controlled switching stage, applies the reverse voltage of terminal 16 briefly to the control grid of switching tube 4, so that the grid capacitance is recharged.

With switching transistor Ts6/9 conductive, current flows over a diode Gr10, resistors R14 and R15 and a pulse transformer Tr2. When the upper switching stage in FIG. 2 is blocked, the current is interrupted. A diode Gr11 prevents discharge of the tube capacitance via pulse transformer Tr2. When the primary current of transformer Tr2 is interrupted, a positive pulse is generated in the secondary windings A and B. Transistors Ts10 and Ts11/12 become conductive briefly and recharge the grid-cathode capacitance of switching tube 4 to the reverse voltage. As in the force-controlled switching stage, the base current is similarly limited by a diode Gr12 so as not to control the transistors into saturation. The transistors Ts11/12 are also controlled through a resistor R16. A choke Dr1, with its selected inductance determines the connection time of the transistors.

When the force-controlled switching stage is connected, transformer Tr2 generates negative pulses on the secondary side which, if required at all (with a connection time of almost 100%), accelerate the blocking of transistors Tr11/12. Resistor R15 is bridged by a capacitor C4, so that the transformer core can be sufficiently magnetized in case of short current pulses. The transformer must be sufficiently damped by resistors in order to avoid building-up processes. With transistor Ts11/12 switched through, diode Gr10 prevents the flow of current through transformer Tr2.

Zener diodes and resistors which are connected in parallel to transistors Ts11/12, limit the collector-emitter voltage to a maximum admissible voltage and prevent charging of the control grid of switching tube 4 during the blockage.

Particularly noteworth in FIG. 2 are the measures for shortening the switching periods, which make it possible to use a semiconductor switch as a driver and thus keep the power loss down to a minimum.

Figure 3:
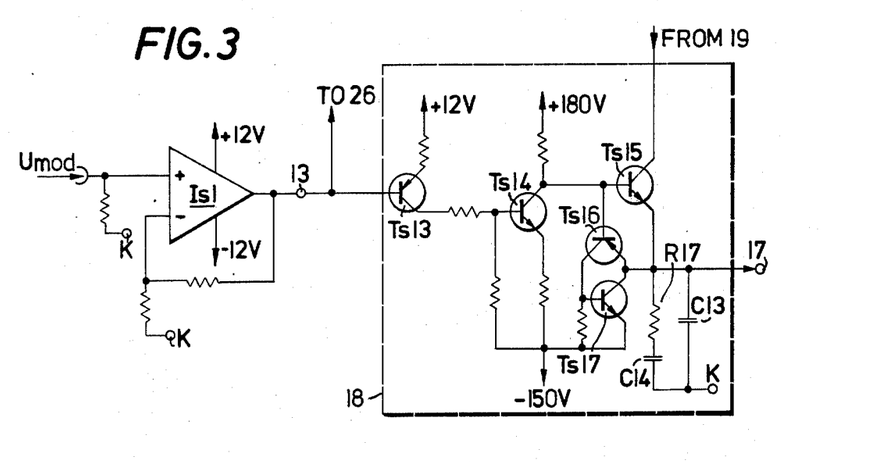
FIG. 3 is a schematic diagram of the control element.

Referring now to FIG. 3, the control element (18 in FIG. 1) is arranged between terminals 13 and 17 and circuit blocks 19 and 15 in FIG. 1. The control element varies the positive of the potentials to be switched by the switching stages in the range of $-120$ V to $+170$ V, compared to the potential on terminal K of the cathode of switching tube 4. The applied modulation voltage U-mod is amplified in a preamplifier Is1 and arrives at terminal 13, from which a shunt leads to low pass filter 26 (FIG. 1).

Transistors Ts13 and Ts14 amplify the output voltage of preamplifier Is1, and a transistor Ts15 is wired as an emitter-follower. Capacitors C13 and C14 reduce the influence of the switching frequency (about 50 kHz) of the semiconductor switch 15 (FIG. 2) on control element 18 represented in FIG. 3. A resistor R17 damps undesired resonances. Transistors Ts16 and Ts17 discharge capacitors C13 and C14 when the discharge over the switching stage following terminal 17 (FIG. 2, upper part) is insufficient.

Figure 4:
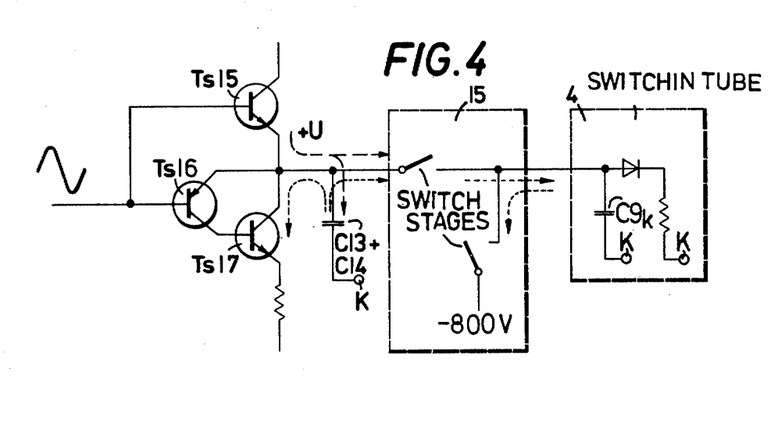
FIG. 4 is a principal circuit diagram of a detail of FIG. 3.

The circuit diagram of FIG. 4, together with the schematically represented semiconductor switch 15 and switching tube 4, illustrates the charging and discharging of capacitors C13 and C14.

Figure 5:
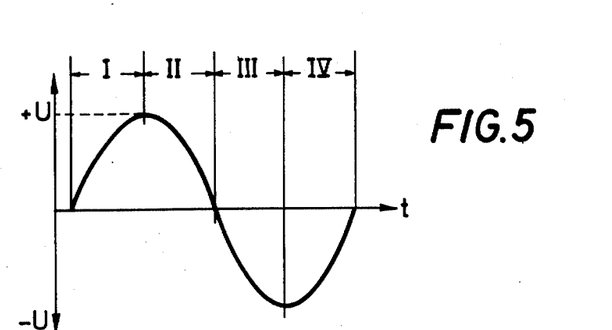
FIG. 5 is a time-related voltage characteristic of the circuit of FIG. 4.

As shown in FIG. 5, in which the voltage on the capacitors is represented without the undesired superposed switching frequency of semiconductor switch 15 which is about 50 kHz, the capacitors C13 and C14 are charged to a voltage corresponding to the base control by transistor Ts15 in the first quarter I of an oscillation period. In the second quarter II, the discharge is effected primarily by the grid current of switching tube 4. In the third quarter III, the discharge depends on the modulation frequency: at low frequencies, the discharge is effected by the charging current of grid capacitance Cgk; small amounts of charge flow off in the time with the switching frequency over the grid capacitance as intermediate accumulators to the reverse voltage ($-800$ V). At high modulation frequencies, e.g., over 1 kHz, the amounts of charge that flow off are insufficient; the discharge is effected primarily by transistors Ts16 and Ts17 which become conductive at a negative base-emitter voltage of transistor Ts15. In the fourth quarter IV, the capacitors are again charged by transistor Ts15.

A difficulty results regarding the values of the filter capacitors C13 and C14, which should be small so as not to stress the control element (18 in FIG. 3) too much at high modulation frequencies. On the other hand, an increase of the filter capacitors to improve the switching behavior of transistor Ts15 is desired. By reducing the internal resistance at high frequencies, a good compromise in the value of the filter capacitors can be reached to achieve a good switching behavior.

Figure 6:
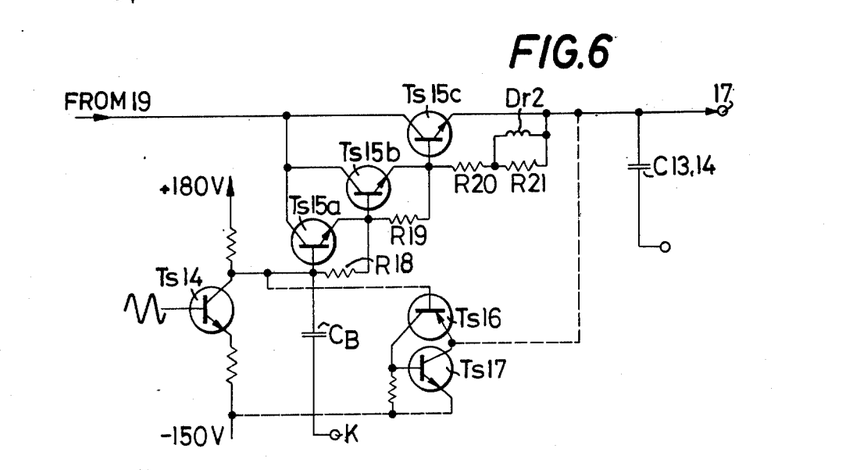
FIG. 6 is an alternate design of a detail of FIG. 3.

For an illustration, reference is made to FIG. 6, which substantially corresponds to the circuit diagram of FIG. 3, but in which transistor Ts15 is replaced by a cascade connection of transistors Ts15a, Ts15b and Ts15c. In order to reduce the internal resistance at high frequencies, a capacitor $C_B$ is arranged at the base of the first emitter-follower transistor Ts15a. Capacitor $C_B$ is selected so that the band width of the emitter-follower for the modulation frequency is only slightly influenced. With increasing frequency, capacitor $C_B$ becomes more and more low-ohmic and compensates the current amplification factor dropping to higher frequencies. During the switching process of the switching stages of the semiconductor switch shown in FIG. 2, high-frequency current components are formed which act almost fully down to the base of the emitter-follower transistor Ts15a. These current peaks are supplied by capacitor $C_B$.

In order to reduce the switching time, resistors R18 to R21 and a choke Dr2 are arranged in parallel to the base-emitter diode of the transistors Ts15a to Ts15c whose value is optimized to a low switching time and a minimal loss of the current amplification factor.

It is noteworthy that in the control element (18 in FIG. 1) illustrated in FIGS. 3 to 6, the operating voltage or collector-emitter voltage of transistor Ts15 arriving from chopper 19 is not constant, but is always slightly greater than the latter in the regions I and II of the base voltage, which has the same course as the emitter voltage shown in FIG. 5, while the operating voltage in the regions III and IV is only slightly above the time axis, that is, above the mean value in time of the base voltage. This has the effect that the power loss in transistor Ts15, which depends on the collector-emitter voltage, is kept smaller than if the collector voltage were to be kept at a constant value which is above the voltage peaks of the base voltage and emitter voltage. The collector voltage which is supplied by the chopper fluctuates in time with relatively low-frequency portions of the modulation voltage of under 300 cycles, for example. Due to the spectral energy distribution in program modulation, a marked improvement in the efficiency of the control element is thus obtained.

The way in which the collector voltage of transistor Ts15, on the one hand, is stabilized and, on the other hand is varied, in dependence with the low-frequency portions of the modulation voltage, will be shown in reference to FIGS. 7 to 10, which concern chopper 19 and the associated control circuit.

Figure 7:
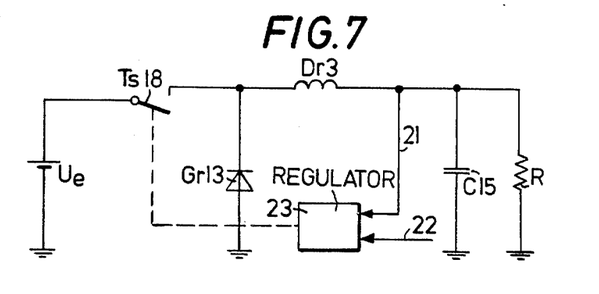
FIG. 7 is a principal circuit diagram of the control circuit provided for stabilizing a potential.

FIG. 7 shows a principal circuit diagram of the chopper with a control loop designed for voltage stabilization only. A DC voltage source $U_e$ is followed by a transistor Ts18, represented as a controllable switch, which is alternately conducting and blocking. In the conducting state, the load current flows from the voltage source over an accumulation choke Dr3, which forms, together with a capacitor C15, the filter means for the chopper and it then flows to the load R. Energy is stored in the choke. When transistor Ts18 blocks, the current flows over a commutation diode Gr13 and choke Dr3 to the load. The principle is the same as described in German Pat. No. 1,218,557 and as mentioned in connection with switching tube 4, accumulation choke 3, 11 and commutation diode 12. By controlling the respective connection time of transistor Ts18, which is switching with a constant frequency, it is possible to influence the voltage of load R or to keep it constant by regulation.

Regulator 23 is used for regulation, and the actual value and a nominal value are fed to regulator 23 over lines 21 and 22, respectively.

Since the chopper with the associated control circuit is not only to be used for stabilizing and reducing the voltage, that is, as a transformer substitute, but also is used to reduce the power loss at low frequencies in the following control element 18 in FIG. 1, and also to supply an output voltage, which is variable within certain limits with the modulation voltage, an additional guide quantity must be introduced into the control circuit. This is done in the embodiment represented in FIG. 8, by superposing the guide quantity on the actual value.

Even if no modulation voltage-dependent guide quantity were supplied, a nominal value would be required for voltage stabilization. It would be fed to regulator 23 on line 22, see FIG. 1. The same holds true for the actual value and line 21. The nominal value is a triangular voltage with a frequency of about 20 kHz to ensure that transistor Ts18 is constantly guided with this frequency and not controlled conductively.

Figure 8:
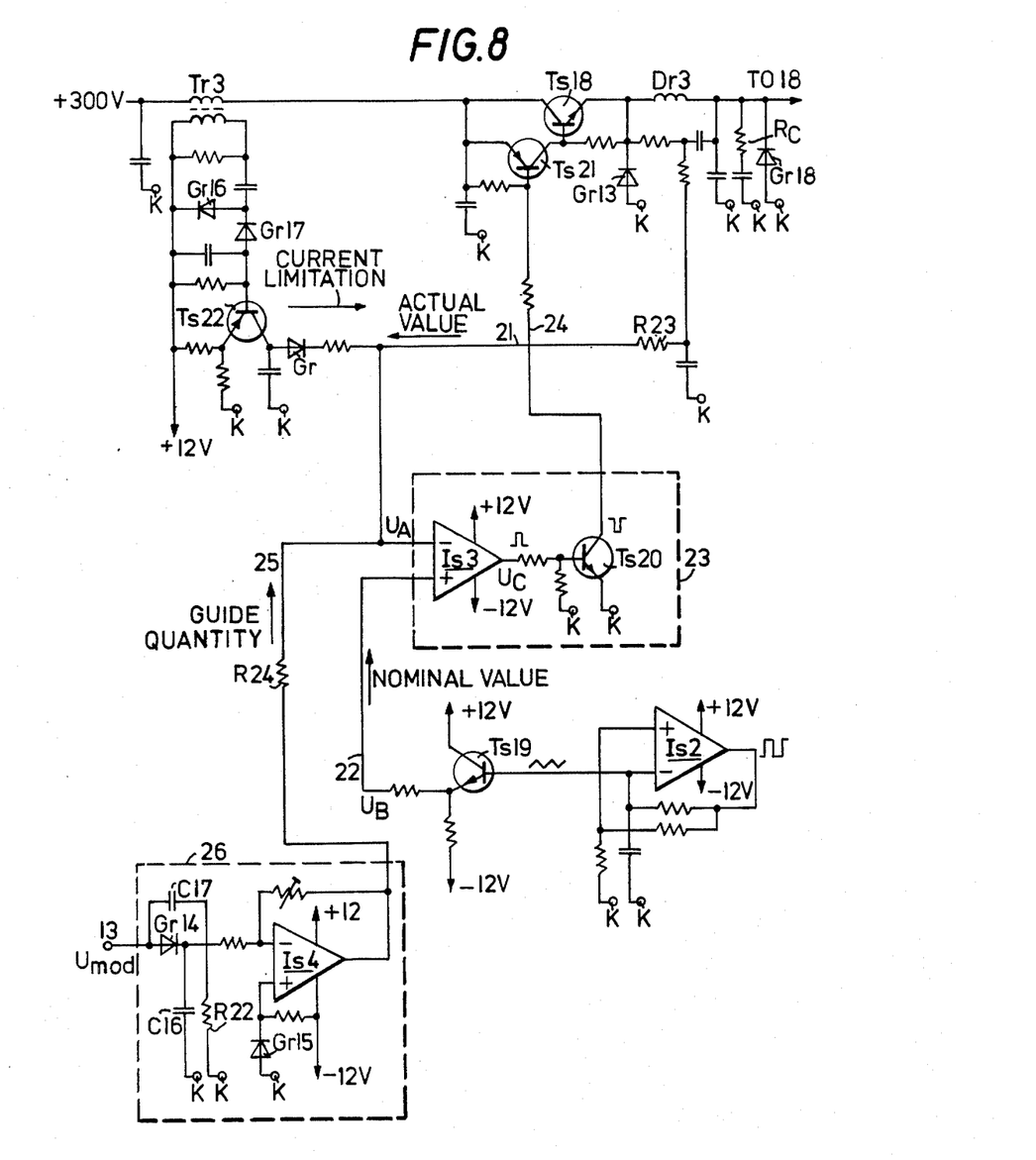
FIG. 8 is a detailed circuit diagramm according to FIG. 7.

An operation amplifier Is2 is operated by coupling as a triangular voltage generator. A transistor Ts19 is wired as an emitter-follower (impedance converter). A voltage formed from the guide quantity on line 25 and the actual value on line 21 is compared by a comparator Is3 with the delta-voltage on line 22.

Figure 9:
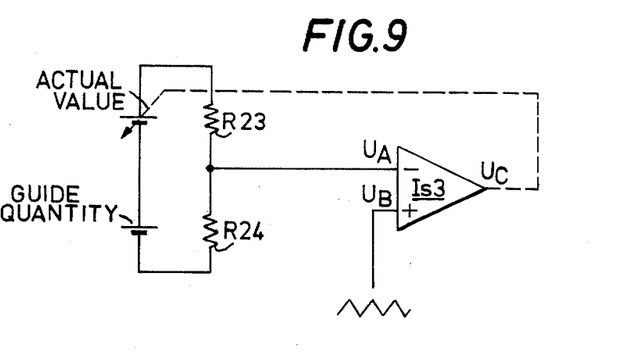
FIG. 9 is a principal circuit diagram to the control circuit contained in FIG. 8, extended by means for influencing the regulated quantity.
Figure 10:
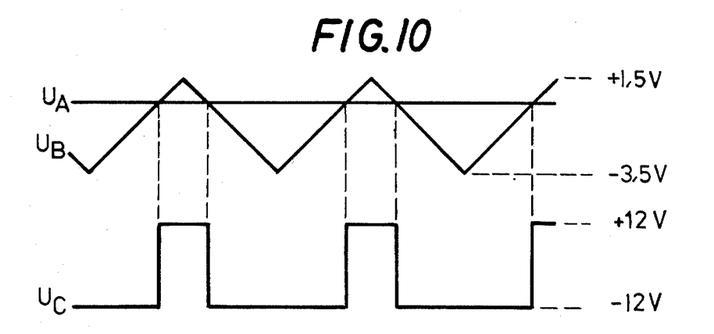
FIG. 10 shows voltage characteristics illustrating FIG. 9.

FIGS. 9 and 10 illustrate the function. With a positive output voltage $U_C$ of comparator Is3, the transistors Ts20 and Ts21, as well as transistor Ts18 become conductive. This is always the case when triangular-voltage $U_B$ exceeds the voltage $U_A$ formed of the guide quantity and the actual value. An auxiliary pulse time-modulated signal in the form of a negative output voltage $U_C$ causes blockage of the above-mentioned transistors. With transistor Ts18 on, the load current flows from the voltage source (+300V) over accumulation choke Dr3 to the load, that is, over control element 18 in FIG. 1 to terminal 17. When transistor Ts18 blocks, the current flows over a commutation diode Gr13 to the load.

For generating the modulation voltage-dependent guide quantity on line 25, the modulation voltage $U_{mod}$ is conducted from terminal 13 over a circuit part with the function of a low-pass filter 26. A capacitor C16 is charged to the peak value of the modulation voltage over a rectifier Gr14. The discharge is effected over resistor R22 as well as the wiring of an operation amplifier Is4. At higher modulation frequencies, a discharge also takes place over capacitor C17 for adaptation to the frequency course of the control element 18 in FIG. 1. Operation amplifier Is4 inverts the voltage of capacitor C16. The feedback is adjustable. The forward voltage of diode Gr14 is compensated by diode Gr15. Capacitor C16 is very small so that a cut-off frequency of about 100 Hertz is obtained with resistor R22.

The preference of the low frequencies in low-pass filter 26 and peak value rectification at high frequencies is necessary in the present embodiment because distortions would appear in transistor Ts18, due to the relatively low switching frequency of operation amplifier Is2, and accumulation choke Dr3 with the following filter capacitors being possibly excited into resonances.

With the scanning ratio of transistor Ts18 unchanged, the variation of the output voltage of the chopper, at the same time actual value, fed to control element 18 is proportional to the variation of the low frequency portions of the modulation voltage $U_{mod}$. If the line voltage rises, for example, the output voltage likewise rises. As can be seen from FIGS. 9 and 10, an increase of the actual value with a constant guide quantity results in an increase of voltage $U_A$. According to FIG. 10, the scanning pulses $U_C$ of +12V become narrower by a displacement of voltage $U_A$ in the direction of +1.5V. The changed scanning ratio results in a reduction of the output voltage of the chopper leading to control element 18 to approximately the output value before the line voltage variation. The triangular oscillation is fixed with its extreme values (+1.5V and −3.5V) so that the output voltage of the chopper, in the absence of a modulation voltage, is about +80V, but can vary following the modulation voltage in the range of +170V to practically 0.

The chopper is protected against short-circuit by an additional control. To this end, a transformer Tr3 is cut into the feed to switching transistor Ts18. By doubling the voltage with diodes Gr16 and Gr17, a voltage is obtained which is, independent of the scanning ratio, proportional to the switching current. When the admissible limiting current for transistor Ts18 has been attained, a biased transistor Ts22 becomes conductive and effects, by a variation (rise) of voltage $U_A$, a great reduction of transistor Ts18.

A rectifier Gr18 at the output of the chopper protects the latter against negative voltage, which could appear in case of trouble at the output. A parallel RC sector damps the building-up processes of accumulation choke Dr3 appearing in a modulation.

While a specific embodiment of the invention has been shown and described in detail to illustrate the application of the principles of the invention, it will be understood that the invention may be embodied otherwise without departing from such principles.

What is claimed is:

1. A modulation amplifier having an output amplifier element which contains an accumulation choke, a switching tube and a low-pass filter connected in series, with a commutation diode connected to the switching tube, the switching tube being controlled by pulse duration modulated pulses, comprising, a semiconductor switch connected to the switching tube and fed by the pulse duration-modulated pulses, said semiconductor switch including two branches, each connected to a different electric potential and each including a controlled semiconductor rectifier acting as a switch, one of said branches being driven into a conducting state and the other of said branches being driven into a nonconducting state upon a potential jump of the pulse duration modulated pulses in either the positive or negative direction, a control circuit for stabilizing at least one of the different electric potentials, said control circuit comprising a switch element acting as a primary control element which is controlled by an auxiliary pulse duration-modulated signal, and a chopper with a following filter means for converting the auxiliary pulse duration-modulated signal into an actual value to be fed to said control circuit.

2. A modulation amplifier, according to claim 1, wherein said one of said branches which is in a conductive state to block the switching tube is driven from the start of the pulse duration-modulated pulses for switching said one branch, but not for the entire duration of the switching.

3. A modulation amplifier, according to claim 1, wherein said control element precedes at least one of said branches for co-modulating its associated potential in time with a fundamental osciallation of the pulse duration modulated pulses, whereby, the associated potential varies in the branch in accordance with the fundamental oscillation.

4. A modulation amplifier, according to claim 3, wherein the switching tube includes a screen grid, and said control element is connected ahead of at least one of said branches which is connected to the higher positive potential.

5. A modulation amplifier, according to claim 3, wherein a transverse capacitor is connected at an output of said control element to function as a charging accumulator.

6. A modulation amplifier, according to claim 5, including a control element (18) preceding said branch connected to said potential (terminal 17), a current path (Ts17 in FIG. 3) is provided for discharging the transverse capacitor (C13, C14) during each half (III in FIG. 5) of the half waves of the co-modulated first potential (+U) tending toward the other potential (−U) at high co-modulation frequencies.

7. A modulation amplifier, according to claim 3, wherein said control element (18 in FIG. 1), which serves to vary the controlled quantity (output voltage of chopper 19) in accordance with portions of the fundamental oscillation ($U_{mod}$), is provided between said filter means (Dr3, RC in FIG. 8) and said following branch (transistor Ts6/9 in FIG. 2).

8. A modulation amplifier, according to claim 7, wherein a quantity regulated by the control circuit (21, 23, 24, 19) is controllable.

9. A modulation amplifier, according to claim 8, wherein said control of the controlled quantity is effected with a guide quantity (line 25), which is derived from the fundamental oscillation ($U_{mod}$) of the pulse duration-modulated pulses.

10. A modulation amplifier, according to claim 8, wherein said control element (18) contains at least one emitter-follower (transistor Ts15, Ts15a, Ts15b, Ts15c in FIGS. 3 and 6, respectively).

11. A modulation amplifier, according to claim 10, wherein a base-emitter diode of at least one emitter-follower (transistors Ts15a, Ts15b, Ts15c) is connected in parallel to at least one resistor (R18, R19, R20).

12. A modulation amplifier, according to claim 10, including several emitter-followers in cascade connection, and a capacitor (CB) is connected in parallel to the input of the first emitter-follower (transistor Ts15a).

* * * * *